United States Patent [19]

Pease

[11] 4,153,843
[45] May 8, 1979

[54] MULTIPLE BEAM EXPOSURE SYSTEM

[75] Inventor: Roger F. W. Pease, Holmdel, N.J.

[73] Assignee: Bell Telephone Laboratories, Incorporated, Murray Hill, N.J.

[21] Appl. No.: 932,265

[22] Filed: Aug. 9, 1978

Related U.S. Application Data

[63] Continuation-in-part of Ser. No. 780,354, Mar. 23, 1977, abandoned.

[51] Int. Cl.² .............................................. H01J 37/00
[52] U.S. Cl. .............................. 250/492 A; 250/396 R
[58] Field of Search ............... 250/492 A, 398, 492 R, 250/396 R; 313/360, 361, 426

[56] References Cited

U.S. PATENT DOCUMENTS

| | | | |
|---|---|---|---|
| 3,491,236 | 1/1970 | Newberry | 250/492 A |
| 3,619,608 | 11/1971 | Westerberg | 250/492 A |
| 3,715,580 | 2/1973 | Maekawa et al. | 250/492 A |
| 3,736,425 | 5/1973 | Chernow | 250/492 A |
| 3,801,792 | 4/1974 | Lin | 250/492 A |
| 3,914,608 | 10/1975 | Malmberg | 250/492 A |
| 4,093,964 | 6/1978 | Aughton | 358/2 |

Primary Examiner—Bruce C. Anderson
Attorney, Agent, or Firm—Lucian C. Canepa

[57] ABSTRACT

In an improved electron beam exposure system (EBES), a demagnified image of an array (28) of illuminated apertures is focused and scanned over the surface of a resist-coated workpiece (12). A deflection unit (30) is associated with the array of apertures to provide an independent blanking capability for each of the electron beams propagated through the aperture array. Such an EBES can be operated in a faster mode than a conventional system. In addition, the electron dose delivered to each address position on the resist coating (10) can be thereby selectively controlled. Other forms of charge particles may also be used.

23 Claims, 10 Drawing Figures

| FIG. 8A | FIG. 8B |
|---|---|
| FIG. 7 | |

MULTIPLE BEAM EXPOSURE SYSTEM

CROSS-REFERENCE TO RELATED APPLICATION

This application is a continuation-in-part of application Ser. No. 780,354, filed Mar. 23, 1977 abandoned.

BACKGROUND OF THE INVENTION

This invention relates to an apparatus and a method for fabricating microminiature devices and, more particularly, to a multiple-beam scanning technique for use in a charged-particle-beam exposure system.

U.S. Pat. No. 3,900,737, which issued to R. J. Collier and D. R. Herriott on Aug. 19, 1975, describes an electron beam exposure system (EBES) that is a practical tool for generating high-quality fine-featured integrated circuit masks. The system is also capable of exposing patterns directly on resist-coated semiconductor wafers. EBES combines continuous translation of the mask or wafer substrate with periodic deflection of the electron beam in a raster-scan mode of operation.

An advantageous modification of EBES is described in a commonly assigned copending application of R. J. Collier and M. G. R. Thomson, Ser. No. 655,427, filed Feb. 5, 1976, now abandoned and replaced by a continuation filed Nov. 29, 1977, Ser. No. 855,608. In this modified system, the pattern-writing speed of EBES is increased by utilizing a new mode of raster scanning. In the new mode, the writing spot dimensions of the scanning electron beam are varied in a high-speed way during the raster scanning process.

Efforts have been directed at trying to devise still other ways of increasing the pattern-writing speed of EBES. The primary motivation for these efforts is the desire to increase the throughput of such a system. In that way the cost per unit area exposed by the scanning electron beam is reduced and the economic attractiveness of EBES as a lithographic tool is enhanced. Also, another motivation for devising such modifications is the realization that in such a faster system higher throughput can be traded for a finer address structure or for the use of a less sensitive electron resist.

Moreover, in the course of trying to develop improved EBES machines it has been recognized that so-called proximity effects cause undesirable variations in the electron dose delivered to different address positions of the resist material. Hence, efforts have also been directed at attempting to devise simple and reliable techniques for compensating for such effects.

SUMMARY OF THE INVENTION

Accordingly, an object of the present invention is an improved charged-particle-beam exposure system such as an improved EBES characterized by high-speed operation and the capability of compensating for proximity effects.

Briefly, this and other objects of the present invention are realized in a specific illustrative system that comprises an electron column in which a demagnified image of an array of illuminated apertures is focused and scanned over the surface of a resist-coated workpiece. A blanking unit is associated with the array of apertures to provide an independent blanking capability for each of the electron beams propagated through the aperture array. Such an EBES can be operated in a faster mode than can a conventional system. In addition, the illustrative system can be operated to selectively control the electron dose delivered to each address position on the resist coating thereby to compensate for proximity effects.

BRIEF DESCRIPTION OF THE DRAWING

A complete understanding of the present invention and of the above and other objects, features and advantages may be gained from a consideration of the following detailed description presented hereinbelow in connection with the accompanying drawing, in which.

DETAILED DESCRIPTION

Figure 1:
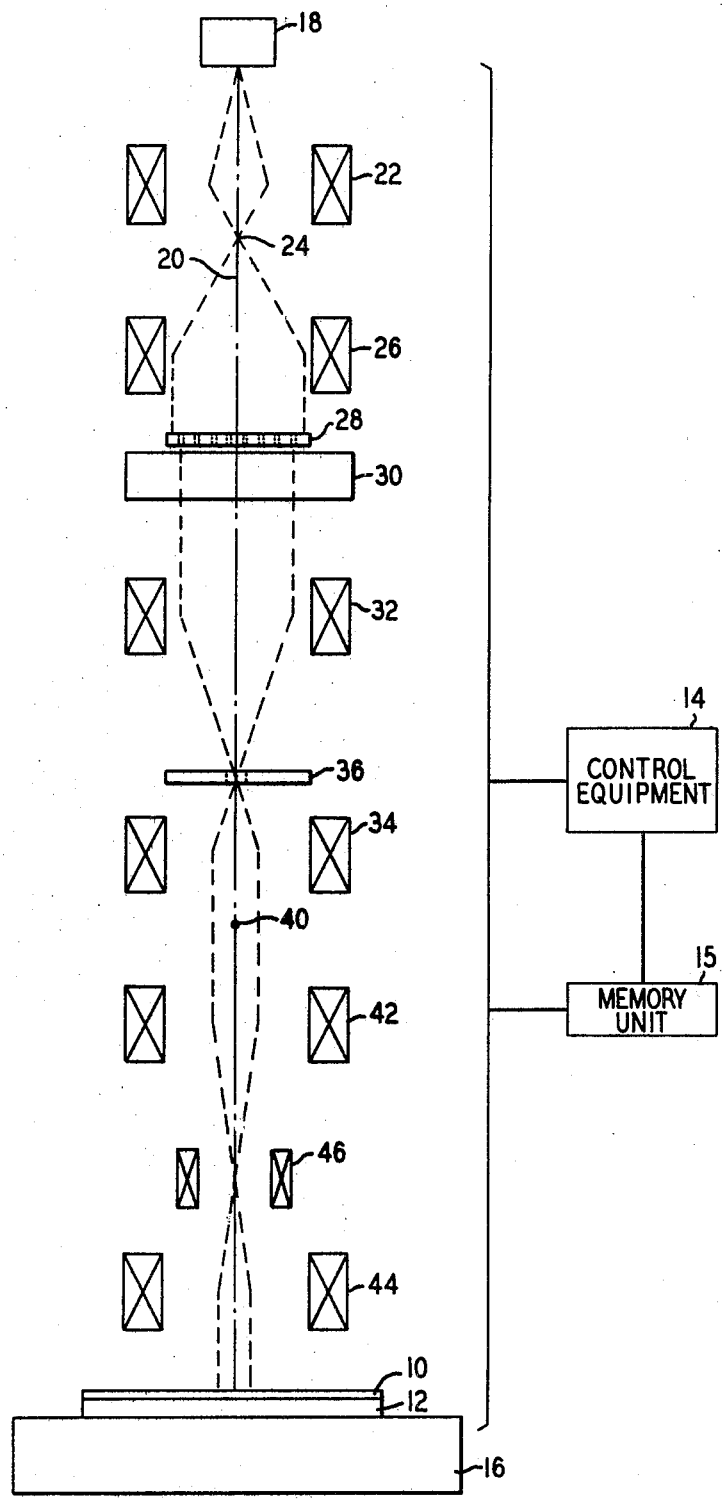
FIG. 1 shows in simplified form a specific illustrative electron column made in accordance with the principles of the present invention.

FIG. 1 depicts a specific illustrative lithographic apparatus made in accordance with the principles of the present invention for controllably scanning plural small-size electron spots over the top surface of an electron-resist layer 10 supported on a substrate 12. In turn, the substrate 12 is mounted on a conventional x-y-movable table 16.

Various positive and negative electron-resist materials suitable for use as the layer 10 are well known in the art. By selectively scanning plural electron spots over the surface of the resist layer 10 in a highly accurate and high-speed manner, as described later below, it is possible to make integrated-circuit masks or to write directly on a resist-coated wafer to fabricate extremely small and precise low-cost integrated circuits. Some suitable resists for use as the layer 10 are described, for example, in a two-part article by L. F. Thompson entitled "Design of Polymer Resists for Electron Lithography," *Solid State Technology*, part 1: July 1974, pages 27–30; part 2: August 1974, pages 41–46.

The apparatus of FIG. 1 may be considered to comprise two main constituents. One is an electron beam column to be described in detail below, which is characterized by highly accurate high-speed deflection capabilities similar to those exhibited by the column described in U.S. Pat. No. 3,801,792, issued Apr. 2, 1974 to L. H. Lin. Additionally, in accordance with the principles of the present invention, the depicted column is further characterized by the capability of scanning multiple independently blanked beams over a resist-coated workpiece. This last-mentioned capability in particular will be described in detail below.

The other main constituent of the FIG. 1 apparatus comprises control equipment 14 and a memory unit 15. Illustratively, the equipment 14 is of the type described in the aforecited Collier-Herriott patent. The memory unit 15 is associated with and controlled by the equipment 14. Binary representations stored in the unit 15 are determinative of whether or not each of the multiple scanning electron beams is on or off at spaced-apart address positions defined on the surface of the resist-coated workpiece. Together the units 14 and 15 supply electrical signals to the depicted column to systematically control scanning and blanking of the multiple electron beams provided therein. Moreover, these units supply control signals to the x-y table 16 to mechanically move the work surface 10 during the electron beam scanning operation, as described in the Collier-Herriott patent.

The specific illustrative electron column of FIG. 1 includes a conventional source 18 for providing a beam of electrons. The cross-sectional outline of the electron beam provided by the source 18 of FIG. 1 is represented in the drawing by dashed lines. As indicated in FIG. 1, the paths of electrons emitted by the source successively diverge and converge as the electrons travel downstream along longitudinal axis 20 toward the work surface 10.

Illustratively, the source 18 comprises a standard lanthanum boride electron emitter characterized by a source diameter of about 20 micrometers and an initial beam divergence angle of about $4 \times 10^{-2}$ radians.

The electron beam provided by the source 18 of FIG. 1 propagates through a conventional electromagnetic lens 22 (for example an annular coil with iron pole pieces) which forms an image of the source at crossover point 24. Subsequently, the beam is directed by another standard lens 26 in the manner indicated by the dashed lines to impinge orthogonally onto an apertured plate member 28. The electron beam provided by the column of FIG. 1 is designed to illuminate substantially and uniformly the apertures in the plate 28. At the surface of the plate 28, the diameter of the incident beam is, for example, approximately 3 millimeters.

Figure 2:
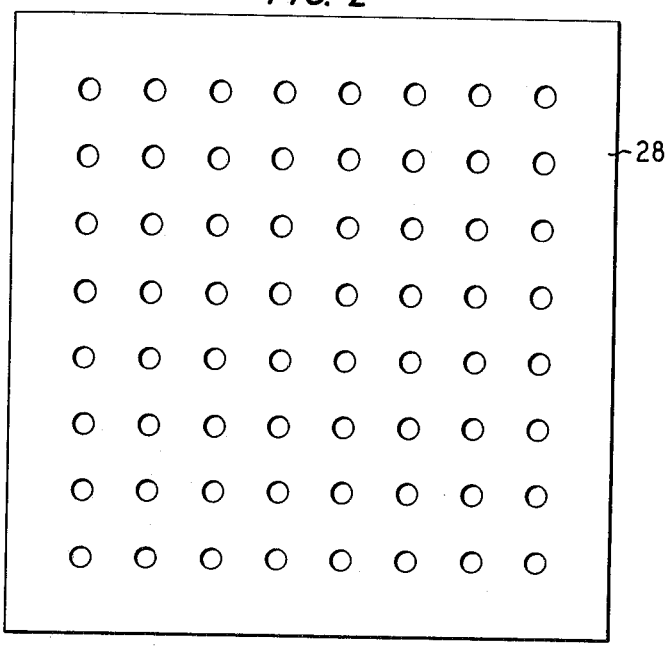
FIG. 2 is a top view of a multiply apertured plate member included in the column of FIG. 1.

In accordance with one specific illustrative embodiment of the principles of this invention, the plate 28 of FIG. 1 comprises a square member about 2 millimeters on a side having an 8-by-8 array of equally spaced-apart circular apertures formed therethrough (see FIG. 2). By way of example, each of the depicted 64 apertures is approximately 100 micrometers in diameter and the center-to-center spacing of adjacent apertures is about 250 micrometers.

Accordingly, the column of FIG. 1 provides multiple individual electron beams on the downstream or bottom side of the apertured plate member 28. Next, in accordance with the present invention, the beams propagate through a deflection unit 30 which is adapted to provide an independent blanking capability for each of the noted individual beams.

In a typical single-point scanning system only a very small fraction (less than 0.1%) of the cathode current reaches the target. By allowing multiple beams to impinge on the target that fraction is increased by a factor approximately equal to the number of beams because the available current density tends to be fixed by the electron gun.

One specific illustrative embodiment of the deflection unit 30 will be described in detail below. But before doing so the other components depicted in FIG. 1 will be specified. Those components include additional conventional lenses 32 and 34 and a plate 36 positioned therebetween. The plate 36 has a single centrally positioned hole therethrough which functions as a blanking aperture. Beams that are not deflected by the unit 30 are directed by the lens 32 to pass through the aperture in the plate 36. On the other hand, beams that are deflected by the unit 30 are directed to impinge upon a nonapertured portion of the plate 36. Such beams are, of course, blocked from appearing on the downstream side of the plate 36.

The electromagnetic lenses 32 and 34 constitute a conventional symmetric doublet. In the absence of any beam blanking provided by the deflection unit 30 acting in conjunction with the apertured plate 36, these lenses form an intermediate demagnified image of the entire aperture array defined by the plate member 28. The image appears, for example, in a plane that is perpendicular to the axis 20 of FIG. 1 at point 40.

Further demagnification of the aforenoted array of electron beams is achieved by additional conventional lenses 42 and 44, which are schematically represented in FIG. 1. In addition, the beams are selectively deflected in unison by a standard electromagnetic raster scanning unit 46 to appear at specified spaced-apart positions in a particular sub-area of the work surface 10. Access to other sub-areas of the surface 10 is gained by mechanically moving the surface by means, for example, of a computer-controlled micromanipulator, as described in the aforecited Collier-Herriott patent.

Thus, by means of the specific illustrative apparatus depicted in FIG. 1, an array of spaced-apart electron beams is directed at and raster scanned over the surface of a resist-coated workpiece. By way of example, each such beam is circular in cross-section and has a diameter of 0.25 micrometers at the surface of the resist layer 10. During the scanning process, intensity modulation of each beam is carried out at successive address positions. At each address position during successive spaced-apart linear scans, each electron beam is blanked or not independently of the other scanning beams. Illustratively, 512 equally spaced-apart address positions are assumed to lie along each line scanned by a beam.

As each individual electron beam spot is deflected along a column of the scan field in accordance with the invention, the spot is intensity modulated at, for example, a 10 megahertz rate by the beam blanking unit 30 acting in conjunction with the apertured plate member 36 of FIG. 1. This modulation rate corresponds with a single-address exposure time of 100 nanoseconds, which is compatible with the sensitivities of available electron resist materials.

Figure 3:
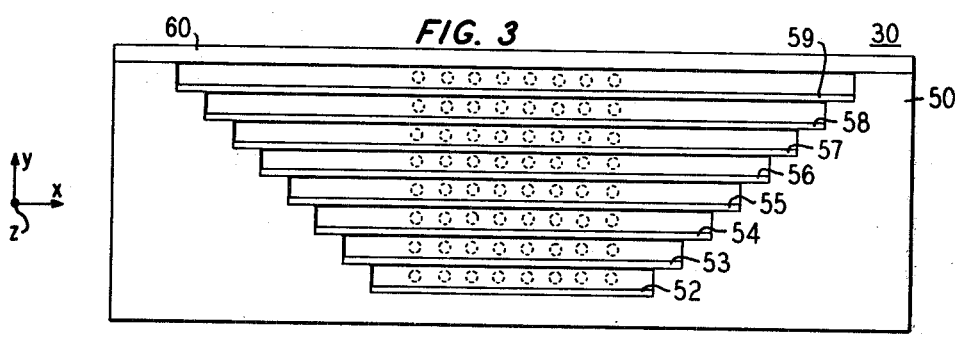
FIG. 3 is a top view of a deflection unit designed to provide an independent blanking capability for each of multiple electron beams respectively propagated through the apertures of the FIG. 2 plate member.

A top view of the deflection unit 30 of FIG. 1 is shown in FIG. 3. The unit comprises a mounting block 50 made of an insulating or conducting material and having, in one specific illustrative embodiment, eight thin metallized plates 52 through 59 mounted thereon. Further, a conductive ground plate 60 is mounted on the block 50.

Dashed-line circles have been included in FIG. 3 to indicate the alignment with the unit 30 of the individual electron beams emanating from the apertured plate member 28 (FIG. 1). Each circle in FIG. 3 represents the cross-section of one such beam as it propagates through the unit 30. In the particular arrangement shown in FIG. 3, electrode fingers patterned on one side of each of the plates 52 through 59 are respectively disposed in the z direction adjacent one side (for example the bottom side) of the depicted beams. An unpatterned conductive member is located on the top side of each row of beams in FIG. 3 and is electrically connected to a reference potential such as ground.

Figure 4:
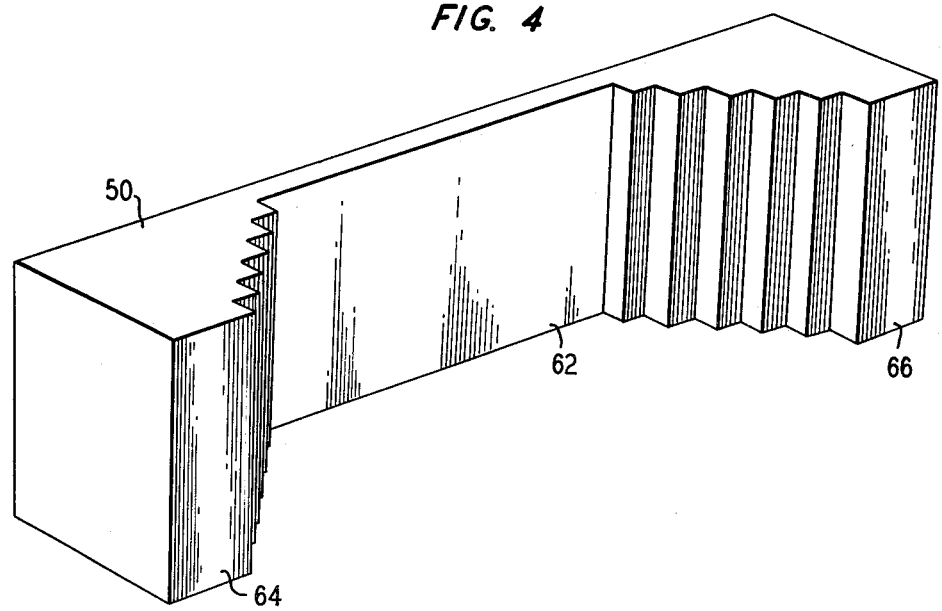
FIGS. 4 and 5 depict component elements of the unit shown in FIG. 3.

A perspective view of the block 50, without the plates 52 through 60 mounted thereon, is shown in FIG. 4. The plate 52 of FIG. 3 is designed to be mounted on the back wall 62 of the FIG. 4 block. The successively wider plates 53 through 59 are adapted to be respectively mounted between corresponding steps of the FIG. 4 block. Finally, the ground plate 60 (FIG.3) is designed to be mounted on the front surfaces 64 and 66 of the FIG. 4 block.

Figure 5:
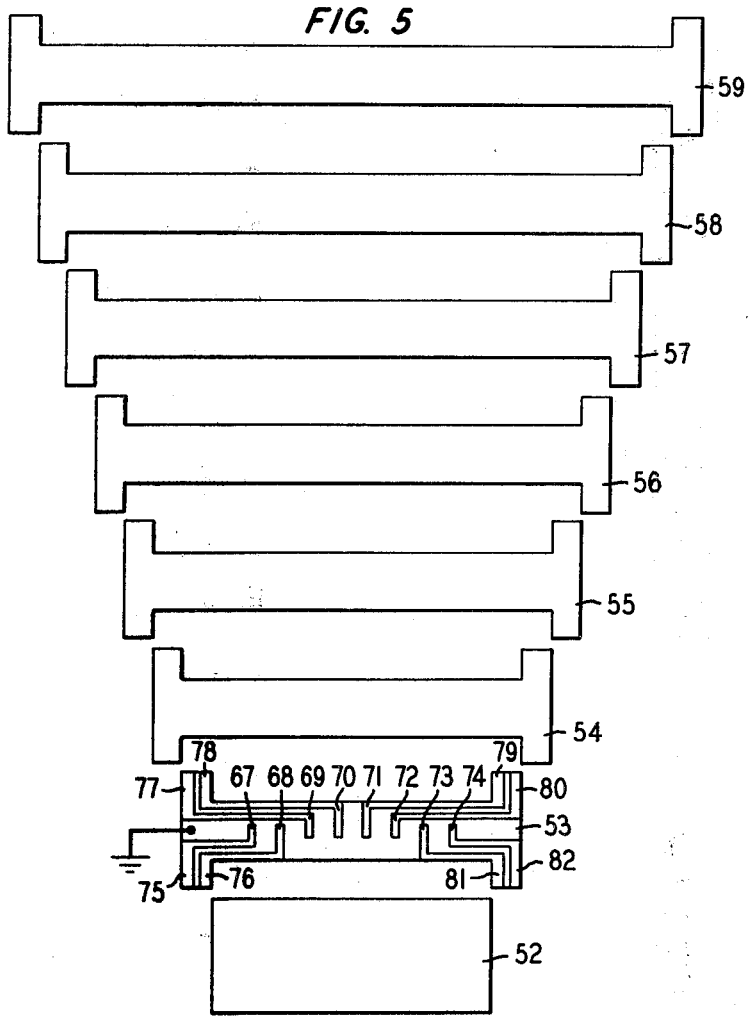

The eight patterned plates 52 through 59 mounted on the block 50 are shown in FIG. 5. Each plate is made from a blank that comprises an insulating member having a thin conductive layer adhered to each side thereof. The conductive layer on one side only of each blank is patterned, for example by laser machining, to form an electrode pattern thereon. Thus, for instance, referring to the plate 53 shown in FIG. 5, it is seen that the conductive layer on the facing side has been patterned to form eight electrode fingers 67 through 74 which are electrically insulated from each other. In turn, these fingers are electrically connected by patterned portions of the conductive layer to terminal regions 75 through 82, respectively, which constitute bonding pads. By means of suitable electrical connections (not shown), voltages are respectively applied to the individual regions 75 through 82 to provide independent blanking potentials to the electrode fingers 67 through 74.

The unpatterned or back side of each of the plates 52 through 59 of FIG. 5 is connected to ground. Moreover, the plate 60 (FIG. 3) is also connected to ground. By means of such a structural arrangement, it is feasible to generate independent blanking signals to deflect any specified one(s) of the multiple electron beams propagated through the unit 30 without causing spurious (FIG. 3) deflections of any of the other beams.

Figure 6:
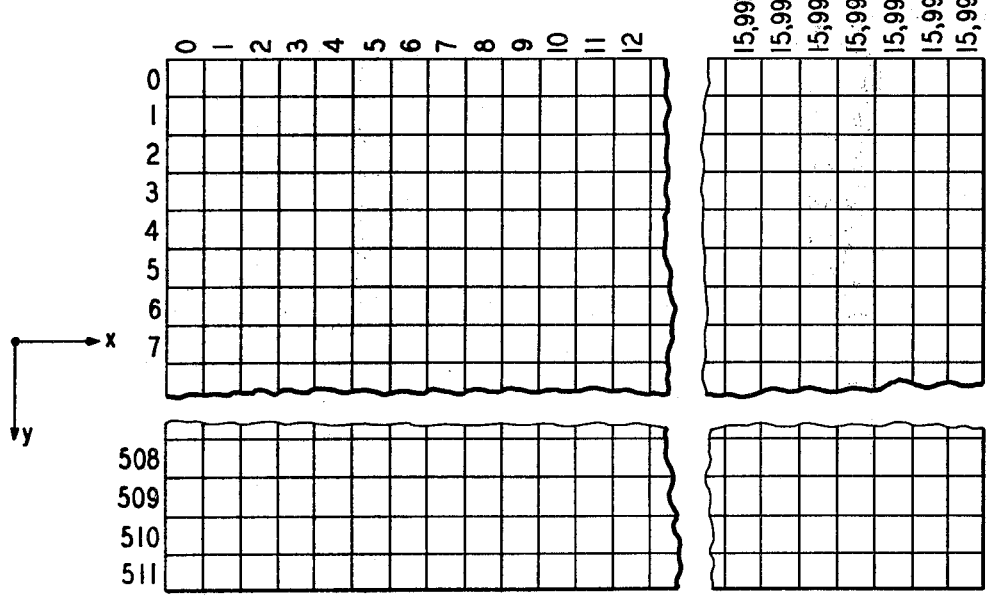
FIG. 6 is a diagrammatic representation of an elemental surface area of a resist-coated workpiece.

An elemental sub-area on the surface of the resist layer 10 (FIG. 1) may be considered to comprise, for example, a rectangle measuring 128 micrometers by 4 millimeters. Such a rectangle, divided conceptually into component squares each 0.25 micrometers on a side, is depicted in FIG. 6. Conventional raster scanning with a single electron beam 0.25 micrometers in diameter occurs in the y direction in a column-by-column fashion as the table 16 continuously moves the work surface in the -x direction. In a standard EBES machine, one round address area at a time is irradiated or not during the course of raster scanning depending, for example, on whether a stored digit representative of the address is a "1" or a "0". Such a mode of operation is described in detail in the aforecited Collier-Herriott patent.

In accordance with one aspect of the principles of the present invention, plural spaced-apart columns at a time of the sub-area represented in FIG. 6 are simultaneously scanned by plural electron beams, respectively. In one particular illustrative case specified herein, eight spaced-apart columns on the work surface are simultaneously scanned by eight independently blanked electron beams. Thus, for example, during one specific scan in the y direction (FIG. 6) the eight beams respectively traverse in unison the columns numbered 7, 14, 21, 28, 35, 42, 49 and 56. During this scan, adjacent beams are spaced apart at the surface of the resist layer 10 (FIG. 1) by seven column widths or address positions in the x direction. Moreover, in accordance with the principles of this invention, each of the scanning beams is independently blanked or not at each address position as it successively traverses the 512 address positions defined along each column.

In one specific mode of operation that embodies aspects of the principles of the present invention, the resist-coated workpiece 12 (FIG. 1) is mechanically moved in the -x direction (FIG. 6) by eight column widths or address positions between successive y-direction scans. Hence, in this mode, for the particular example specified in the paragraph immediately above, the eight beams next respectively traverse in unison the columns numbered 15, 22, 29, 36, 43, 50, 57 and 64. By means of this interleaved scanning manner, it is apparent that each column numbered higher than No. 56 is traversed in the y direction and selectively exposed once by one of the eight scanning beams.

In some cases of practical importance it may not be feasible to have the scanning electron beams as widely separated at the target surface as was specified above. In those cases, the herein-described multiple-beam scanning mode may be implemented by providing additional beam deflection in the x direction (FIG. 6). For example, if the beams were separated by only two column widths at the target surface, columns 1, 3, 5, 7, 9, 11, 13 and 15, for example, would be scanned first and then columns 2, 4, 6, 8, 10, 12, 14 and 16 would be traversed. In that case, additional x deflection is employed to align the beams with the appropriate addresses on the target surface.

In either of the two particular beam-separation cases specified above, the rate of mechanical advance of the resist-coated workpiece is eight columns per y-direction scan instead of one column per scan (which is characteristic of a standard EBES machine). This increase is a direct measure of the increased exposure rate made possible by a system made in accordance with the principles of the present invention.

Emphasis herein has been and will continue to be directed to a particular embodiment of the present invention that comprises an apertured plate having therethrough a two-dimensional array of openings (such as the plate 28 shown in FIG. 2). From the description above, it is already apparent that this type of embodiment is capable of providing a two-dimensional array of electron beams to be selectively scanned over the surface of a workpiece. The advantageous character of such an embodiment will become more apparent later below. But it should be realized that, for some applications of practical interest, an embodiment that comprises an apertured plate having only a linear array of openings therethrough is also a powerful tool. In an embodiment of this latter type, the linear array of apertures extends perpendicular to the electrical sweep direction. (The electrical sweep direction is, for example, the y direction depicted in FIG. 6.)

In the particular illustrative embodiment to be described below, a two-dimensional array of electron beams is provided. Each beam in such an array is independently blanked by means, for example, of the particular unit 30 shown in FIGS. 3 through 5. For conceptual purposes, the unit 30 may be regarded as comprising an 8-by-8 array of independent beam blanking subunits each comprising a pair of electrostatic deflection plates. Such an array comprising 64 individual subunits, is schematically represented in FIG. 7.

Figure 7:
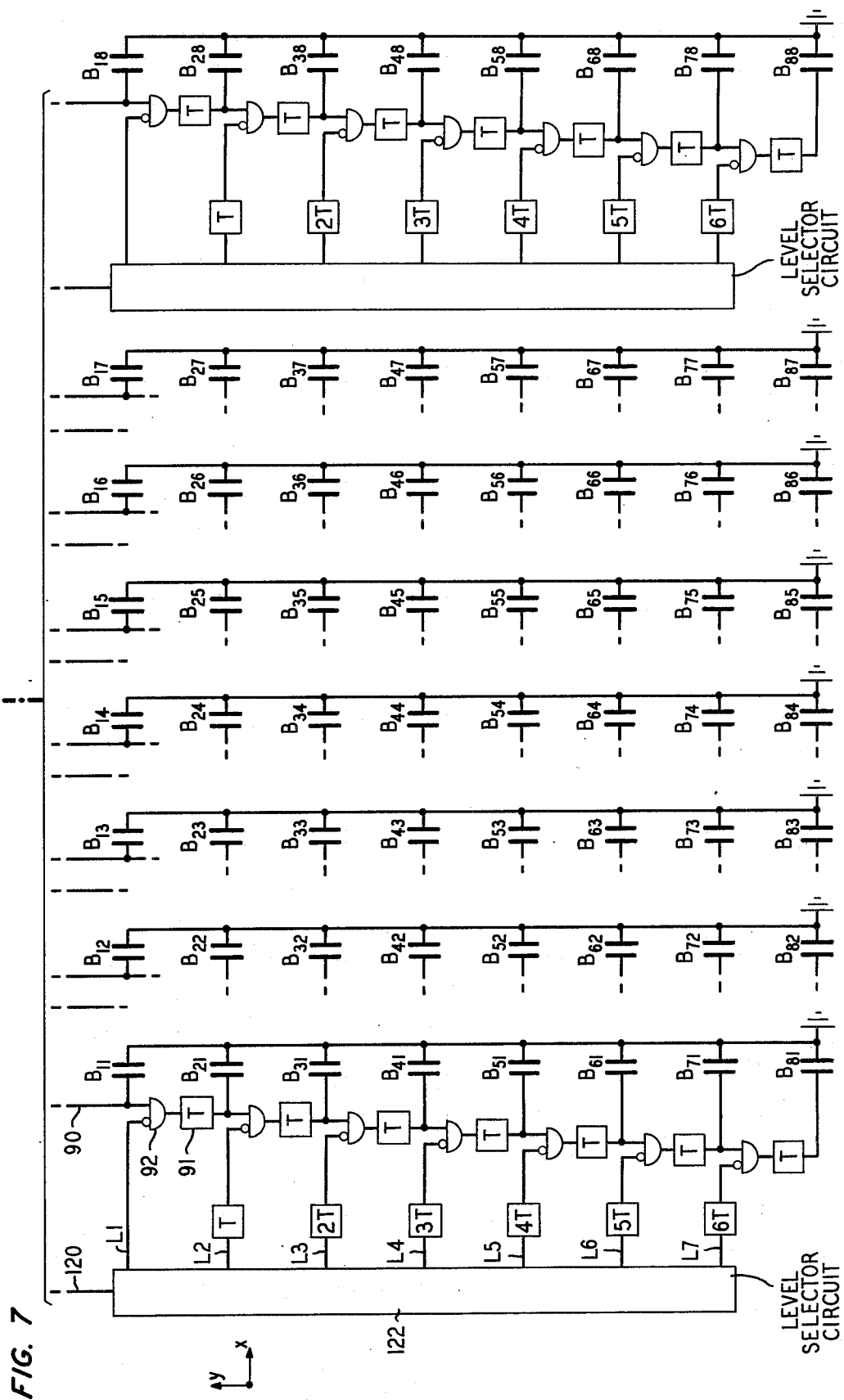
FIGS. 7, 8A and 8B taken together constitute a schematic showing of the manner in which the deflection unit of FIG. 3 is electrically controlled in accordance with one specific illustrative aspect of the principles of the present invention.

The blanking subunits $B_{11}$ through $B_{81}$ shown in FIG. 7 respectively control the eight electron beams scanned along a single column aligned with the y or electronic scan direction at the surface of the workpiece being selectively irradiated. Assume, for example, that adjacent ones of these beams are separated by equal distances such that a given address on the workpiece is exposed T nanoseconds after being exposed by the adjacent scanning beam. In such a case, delaying the blanking signal applied to $B_{11}$ by a time T before applying the signal to $B_{21}$ causes a consistent pattern to be exposed at a given address with twice the electron dose. Such a mode can be extended to the subunits $B_{31}$ through $B_{81}$ to further increase the dose applied to a given address.

The aforementioned mode of operation is achieved simply by applying respective blanking signals to the subunits $B_{11}$ through $B_{18}$ shown in FIG. 7 and then delaying each such signal by T nanoseconds before applying it to each successive subunit in the associated y-direction column of subunits. Thus, for example, in such an arrangement the blanking signal applied via lead 90 (FIG. 7) to the left-hand plate of subunit $B_{11}$ is delayed by T nanoseconds in delay unit 91 before being applied to the left-hand plate of subunit $B_{21}$. In that case, gate unit 92 may be omitted from the depicted circuit and a direct electrical connection made from the left-hand plate of the subunit $B_{11}$ to the top or input side of the delay unit 91. Alternatively, the gate unit 92 may be left in place. In that case, as long as no inhibiting signal is applied to the left-hand input terminal of the unit 92, the signal applied to the right-hand input terminal thereof will be transmitted to the delay unit 91. (In that arrangement, since the unit 92 itself introduces some amount of delay, the delay of the unit 91 must be reduced by that exact amount.)

In the aforespecified illustrative mode of operation, the blanking signal originally applied to $B_{11}$ in FIG. 7 is further successively delayed to control the additional subunits $B_{31}$ through $B_{81}$. In an exactly similar way, the independent blanking signals applied in unison to $B_{12}$ through $B_{18}$, respectively, are also successively delayed before being applied to the indicated subunits thereunder that form the y-direction columns of the array.

Although the above-described mode of operation is attractive for some applications, it is often more desirable in practice to be able to selectively vary the dose at each address rather than to consistently supply an eightfold dose thereto. This desire arises from the fact that scattered electrons from nearby exposed regions partly expose the address currently being exposed. Accordingly, when most of the nearby addresses are exposed, less dose need be applied directly to the address currently being exposed. Since we already have available information on the exposure of neighboring addresses, it is feasible to control the local dose according to specified rules. In that way, it is possible to achieve a more consistently uniform exposure of a resist layer.

Figures 8A, 9:
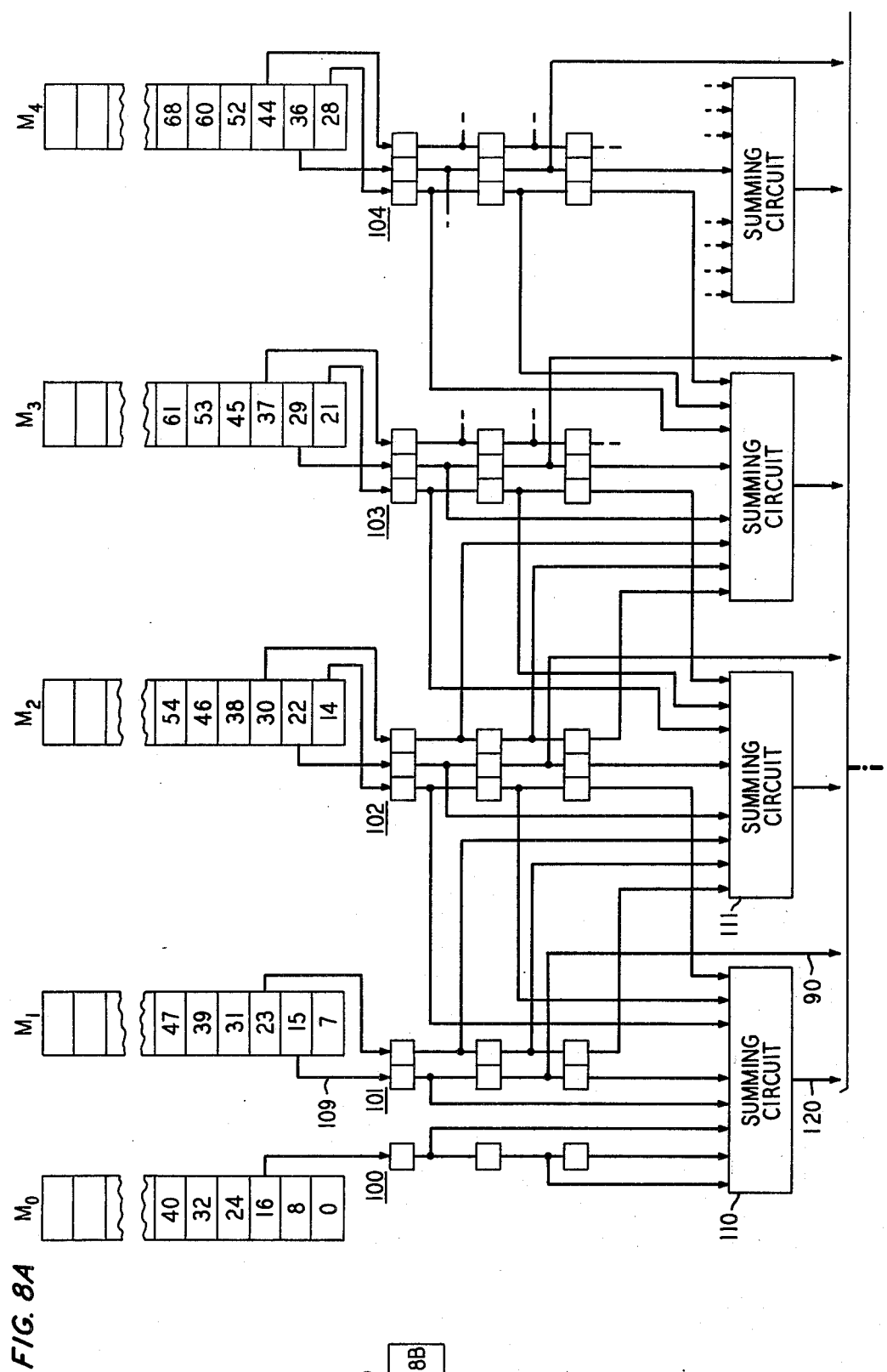
FIG. 9 indicates the spatial alignment among FIGS. 7, 8A and 8B.
Figure 8B:
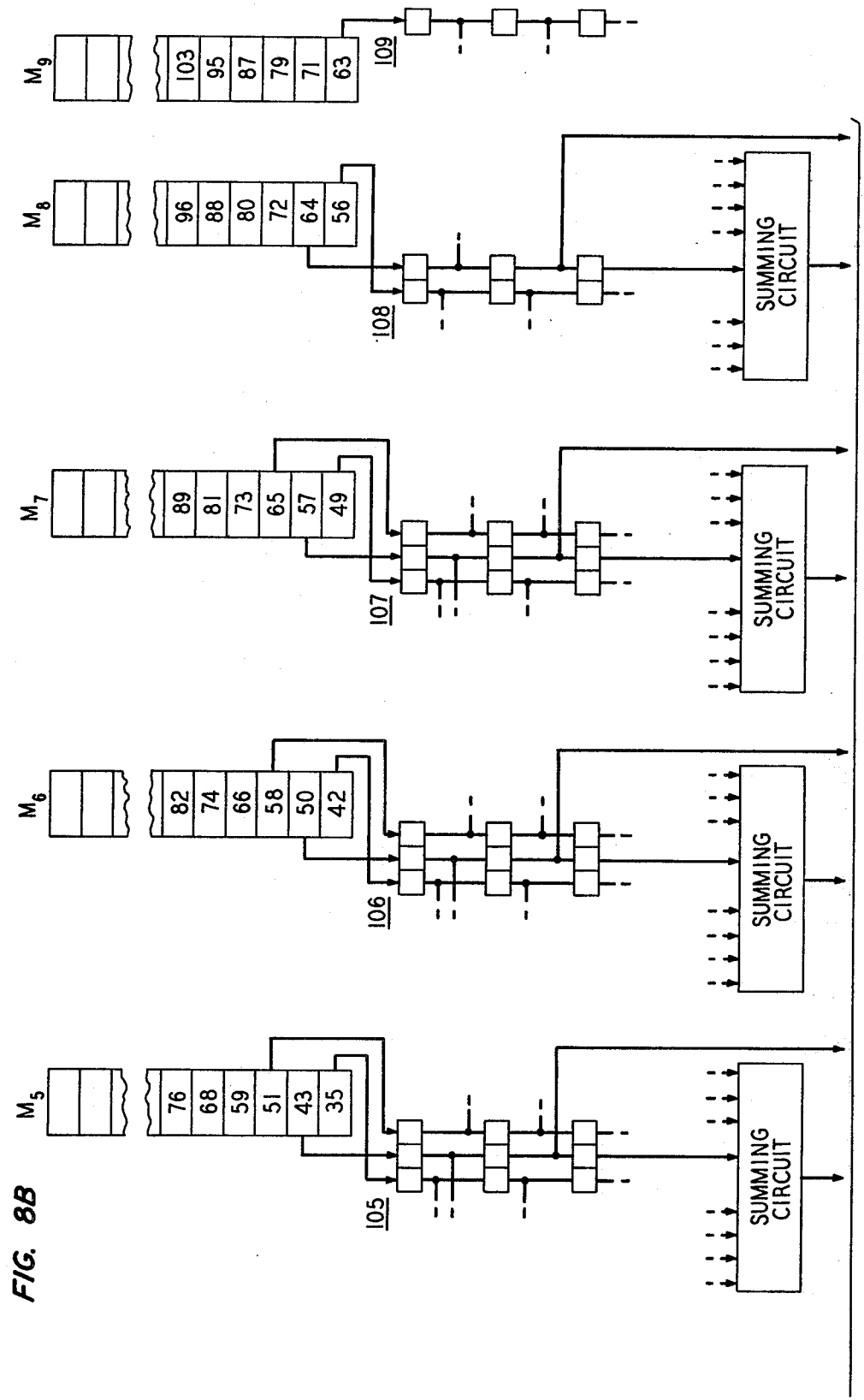

FIGS. 7, 8A and 8B considered together constitute one particular illustrative arrangement in which the eight nearest neighbors or address positions of the address currently being exposed are sampled. Pattern information for the area to be exposed is stored as indicated by column numbers in ten serial memories $M_0$ through $M_9$ (FIGS. 8A and 8B). Thus, for example, the memory $M_1$ contains a predesigned binary representation indicative of the pattern to be exposed in columns 7, 15, 23, 31, 39, 47 . . . . The memory $M_1$ contains in each numbered section thereof a 512-bit number each of whose "0" or "1" digits specifies whether the beam controlled by subunit $B_{11}$ (FIG. 7) is to be off or on, respectively, at the 512 successive address locations in column No. 7.

The 512-bit numbers stored in corresponding sections of the memories $M_1$ through $M_8$ are read out therefrom in unison in serial fashion at a specified frequency. By means of conventional memory read-out circuitry (not explicitly shown in FIGS. 8A and 8B) the contents of corresponding sections of the memories $M_1$ through $M_8$ are respectively applied via shift registers 101 through 108 to blanking subunits $B_{11}$ through $B_{18}$.

Each of the registers 100 and 109 of FIGS. 8A and 8B comprises a single three-stage unit capable of storing three digits. Each of the registers 101 and 108 comprises two three-stage units, whereas each of the registers 102 through 107 comprises three three-stage units. As indicated in FIG. 8A, the pattern information for column No. 15 is stored in memory $M_1$. This information is applied in bit-by-bit serial form via line 109 to the left-hand input of the shift register 101. In turn, this information is applied from the output of the second stage of the left-hand unit of the register 101 via lead 90 to the left-hand plate of the blanking subunit $B_{11}$ in FIG. 7.

In accordance with one particular aspect of the principals of the present invention, the arrangement shown in FIGS. 7, 8A and 8B is configured to sample the eight nearest neighbors or address positions of each of the addresses currently being exposed. Thus, for example, the binary representations respectively indicative of the eight nearest neighbors of the address in column No. 15 currently being exposed by the beam controlled by $B_{11}$ are sampled and applied to a standard summing circuit 110. Assume, for example, that the beam controlled by $B_{11}$ is currently exposing the 250th address position in column No. 15. Signals respectively representative of address positions 249 and 251 in column No. 15 are stored in the bottom and top stages, respectively, of the left-hand unit of the shift register 101. As shown in FIG. 8A, the outputs of these stages constitute two of the inputs of the summing circuit 110. In addition, signals representative of the three nearest addresses in column No. 14 are stored in the left-hand unit of the register 102. These signals are also applied to the summing circuit 110. Moreover, signals representative of the three nearest addresses in column No. 16 are stored in the register 100 and are also applied to the summing circuitry 110, as shown in FIG. 8.

Accordingly, the summing circuit 110 of FIG. 8 receives as inputs eight binary indications respectively representative of whether or not the eight nearest neighbors of the address currently being exposed have been or will be exposed. In response thereto, the circuit 110 supplies an output signal on lead 120 that has the value 0 through 8 depending respectively on how many of the eight sampled representations were "1" signals. In turn, this output signal is applied to a conventional level selector circuit 122 shown in FIG. 7.

The level selector circuit 122 of FIG. 7 includes seven output leads designated respectively, from top to bottom, $L_1$ through $L_7$. If the summing circuit 110 provides an output signal that has the value 7 or 8, then only the output lead $L_1$ supplies a "1" signal. At the other extreme, if the circuit 110 provides an output signal that has the value 0, then none of the output leads $L_1$ through $L_7$ supplies a "1" signal. In the first case (indicative of 7 or 8 of the nearest neighbors being exposed), the "1" signal on $L_1$ serves as an inhibiting signal to block the gate 92 from providing a "1" signal at its output terminal. Hence, no "1" or "expose" signal applied to $B_{11}$ is permitted to propagate down the leftmost column of gates and delay units shown in FIG. 7 to supply "expose" signals to any of the other blanking subunits $B_{21}$ through $B_{81}$. Accordingly, in that case only $B_{11}$ can have a "1" or "expose" signal applied thereto. The beams respectively controlled by $B_{21}$ through $B_{81}$ will therefore not be directed to expose the address currently being exposed by the $B_{11}$ beam. As a result, the total dose to be received by the current address is only one-eighth of the maximum possible dose (assuming an equal dose from each beam).

In the aforementioned other case, wherein none of the leads $L_1$ through $L_7$ of FIG. 7 supplies a "1" signal, the current address will receive repeated doses, at properly timed intervals, by the beams respectively controlled by the subunits $B_{21}$ through $B_{81}$. In that case, the maximum possible dose will be applied to the address currently being exposed. For the other cases, wherein the summing circuit 110 of FIG. 8A provides output signals having the values 1 through 6, respectively, a "1" output signal is supplied by the level selector circuit 122 (FIG. 7) on only $L_7$, $L_6$, $L_5$, $L_4$, $L_3$ and $L_2$, respectively. In turn, each such "1" signal is effective to permit a specified number of the beams controlled by $B_{21}$ through $B_{81}$ to expose the address currently being exposed by the $B_{11}$ beam.

In an exactly similar way to that described above and shown in FIGS. 7, 8A and 8B, sampling, summing, level selecting, signal delaying and controlling are carried out during each y-direction scan for the blanking subunits $B_{22}$ through $B_{82}$, $B_{23}$ through $B_{83}$, $B_{24}$ through $B_{84}$, $B_{25}$ through $B_{85}$, $B_{26}$ through $B_{86}$, $B_{27}$ through $B_{87}$ and $B_{28}$ through $B_{88}$. In that way, eight columns are simultaneously scanned, with the dose delivered to each address position being determined in accordance with the particular illustrative rule specified above.

Finally, it is to be understood that the various above-described techniques and arrangements are only illustrative of the application of the principles of the present invention. In accordance with these principles, numerous modifications and variations may be devised by those skilled in the art without departing from the spirit and scope of the invention. For example, although particular emphasis herein has been directed to the formation and control of multiple electron beams, it is apparent that the principles of this invention are also applicable to and encompass other charged-particle beams such as ion beams. Ion beam sources and associated instumentalities for deflecting and demagnifying such beams are well known in the art. Thus, in accordance with the specific teachings set forth hereinabove, it is evident that a multiple-ion-beam system can be easily devised in a straightforward manner. Such an alternative charged-particle-beam system has obvious applicability to a microminiature device fabrication sequence for carrying out, for example, multiple-beam ion implantation, ion milling steps, and/or ion exposure of resist systems.

I claim:

1. Apparatus for scanning multiple radiant beams over the surface of a radiation-sensitive workpiece to define patterns therein, said apparatus comprising
   a single electron source of radiation,
   means responsive to radiation from said single source for forming multiple spaced-apart radiant beams,
   means for independently blanking each of said beams,
   and means for demagnifying and scanning said independently blanked beams in unison over the surface of said workpiece.

2. Apparatus as in claim 1 wherein said forming means comprises
   a multiply apertured plate member,
   and means for uniformly illuminating one side of said plate member with a radiant beam to form multiple beams respectively emanating from the other side of said plate member from the apertures therethrough.

3. Apparatus as in claim 2 wherein said plate member includes a linear array of apertures therethrough for forming a corresponding linear array of beams.

4. Apparatus as in claim 3 further including means for mechanically moving said workpiece in a first direction,
   and wherein said scanning means comprises means for repeatedly scanning said array of beams in unison over the surface of said workpiece in an interleaved fashion in a direction perpendicular to said first direction.

5. Apparatus as in claim 2 wherein said plate member includes a two-dimensional array of apertures therethrough for forming a corresponding two-dimensional array of beams.

6. Apparatus as in claim 5 further including means for mechanically moving said workpiece in a first direction,
   and wherein said scanning means comprises means for repeatedly scanning said array of beams in unison over the surface of said workpiece in an interleaved fashion in a direction perpendicular to said first direction.

7. Apparatus for scanning multiple radiant beams over the surface of a radiation-sensitive workpiece to define microminiature patterns therein, said apparatus comprising
   means, including only a single electron source, for forming multiple spaced-apart radiant beams,
   means for independently blanking each of said beams,
   and means for scanning said independently blanked beams in unison over the surface of said workpiece.

8. In combination in an electron beam exposure system
   a source of electrons,
   a plate having an array of apertures therethrough for forming a plurality of electron beams,
   means responsive to electrons emitted by said source for forming a beam and simultaneously illuminating all the apertures in said array with said beam thereby to provide an array of beams respectively emanating from said apertures,
   means for demagnifying and scanning said array of beams over the surface of a resist-coated workpiece,
   and means for independently blanking each of said beams.

9. Apparatus for defining a microminiature pattern in a resist layer disposed on a supporting substrate, said apparatus comprising
   means, including only a single electron source, for forming an array comprising multiple spaced-apart radiant beams,
   means for independently blanking the individual ones of said beams,
   means for mechanically moving said substrate,
   and means for scanning said array of beams in unison over the surface of said resist layer in an interleaved fashion as said substrate is moved.

10. Apparatus as in claim 9 wherein said array comprises multiple electron beams arranged in a matrix of rows and columns, said rows being parallel to the direction of mechanical movement of said substrate and said columns being parallel to the direction of scanning, adjacent columns of said beams being spaced-apart at the resist surface by multiple address positions, wherein said blanking means comprises an independent blanking subunit associated with each different one of said array of beams, said subunits also being arranged in a matrix of rows and columns, and means for applying individual blanking signals to said subunits in unison as said array of beams is scanned over the surface of said resist layer in an interleaved column-by-column way.

11. Apparatus as in claim 10 wherein said applying means comprises means for storing digital representations indicative of whether or not each address position in a column to be scanned is to be exposed, means for respectively applying said stored representations to the blanking subunits in the first row of said matrix to control the exposure of particular corresponding address positions in spaced-apart columns at the surface of said resist layer during scanning thereof, means for forming signals indicative of the number of address positions that are or will be exposed neighboring the particular positions currently being exposed, and means responsive to said forming means for controlling a specific number of the additional subunits in each column to also expose the particular positions with their respectively associated beams at successive timed intervals.

12. A high-speed method for defining high-resolution microminiature patterns in a radiation-sensitive layer, said method comprising the steps of providing from a single electron source a single radiant beam, forming from said single beam an array of radiant beams, demagnifying said array and directing it to impinge upon the surface of said layer to appear thereon as an array comprising multiple spaced-apart radiant spots, scanning said array of spots in unison over said surface, and independently blanking the individual spots in said array during scanning.

13. A method as in claim 12 wherein said forming step comprises forming a linear array of radiant beams.

14. A method as in claim 12 wherein said forming step comprises forming a two-dimensional array of radiant beams arranged in rows and columns.

15. A method as in claim 14 comprising the additional step of selectively controlling the radiant dose delivered to each address position in a column on said surface as a corresponding column of spots is scanned thereover.

16. Apparatus for scanning multiple radiant beams over the surface of a radiation-sensitive workpiece to define patterns therein, said apparatus comprising a single electron source of radiation, means for forming multiple spaced-apart radiant beams, means positioned between said forming means and said workpiece for independently blanking each of said beams, and means for demagnifying and scanning said independently blanked beams in unison over the surface of said workpiece.

17. Apparatus as in claim 16 wherein said apparatus is characterized by a single main longitudinal axis along which said aforespecified means are positioned, and wherein said demagnifying and scanning means comprise means positioned along said single axis for generating demagnifying and scanning fields to cause each of said multiple beams to be identically demagnified and scanned with respect to the surface of said workpiece.

18. Apparatus for scanning multiple charged-particle beams over the surface of a workpiece, said apparatus comprising a single source of charged particles, means responsive to particles from said single source for forming multiple spaced-apart beams, means for independently blanking each of said beams, and means for demagnifying and scanning said independently blanked beams in unison over the surface of said workpiece.

19. Apparatus for scanning multiple charged-particle beams over the surface of a workpiece to define microminiature features therein, said apparatus comprising means, including only a single source of charged particles, for forming multiple spaced-apart beams, means for independently blanking each of said beams, and means for scanning said independently blanked beams in unison over the surface of said workpiece.

20. In combination in a charged-particle beam exposure system, a source of charged particles, a plate having an array of apertures therethrough for forming a plurality of charged-particle beams, means responsive to charged particles emitted by said source for forming a beam and simultaneously illuminating all the apertures in said array with said beam thereby to provide an array of beams respectively emanating from said apertures, means for demagnifying and scanning said array of beams over the surface of a workpiece, and means for independently blanking each of said beams.

21. Apparatus for defining microminiature features in a workpiece, said apparatus comprising means, including only a single source of charged particles, for forming an array comprising multiple spaced-apart charged-particle beams, means for independently blanking the individual ones of said beams, means for mechanically moving said workpiece, and means for scanning said array of beams in unison over the surface of said workpiece in an interleaved fashion as said workpiece is moved.

22. A high-speed method for defining high-resolution microminiature features in a workpiece, said method comprising the steps of providing from a single source a single beam of charged particles, forming from said single beam an array of charged-particle beams, demagnifying said array and directing it to impinge upon the surface of said workpiece to appear thereon as an array comprising multiple spaced-apart charged-particle spots, scanning said array of spots in unison over said surface, and independently blanking the individual spots in said array during scanning.

23. Apparatus for scanning multiple charged-particle beams over the surface of a workpiece, said apparatus comprising
a single source of charged particles,
means for forming multiple spaced-apart charged-particle beams,
means positioned between said forming means and said workpiece for independently blanking each of said beams,
and means for demagnifying and scanning said independently blanked beams in unison over the surface of said workpiece.

* * * * *